(12) United States Patent
Lee (10) Patent No.: US 12,398,322 B2
(45) Date of Patent: Aug. 26, 2025

(54) CURABLE RESIN COMPOSITION AND DISPLAY DEVICE HAVING COLOR FILTER LAYER INCLUDING SAME

(71) Applicant: Samsung Display Co., Ltd., Yongin-si (KR)

(72) Inventor: Yun Ho Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 691 days.

(21) Appl. No.: 17/697,964

(22) Filed: Mar. 18, 2022

(65) Prior Publication Data

US 2022/0320185 A1 Oct. 6, 2022

(30) Foreign Application Priority Data

Mar. 22, 2021 (KR) .......................... 10-2021-0036882

(51) Int. Cl.
  *C09K 11/77* (2006.01)
  *H10K 59/12* (2023.01)
  *H10K 59/38* (2023.01)
(52) U.S. Cl.
  CPC .......... *C09K 11/7773* (2013.01); *H10K 59/38* (2023.02); *H10K 59/12* (2023.02)

(58) Field of Classification Search
  CPC ............................ H10K 59/38; C09K 11/7773
  See application file for complete search history.

(56) References Cited

U.S. PATENT DOCUMENTS

| 8,288,656 B2 * | 10/2012 | Lee ...................... C08K 5/0025 430/18 |
| 10,551,033 B2 | 2/2020 | Moon et al. |
| 2019/0296088 A1 * | 9/2019 | Kim ...................... H10K 59/879 |
| 2019/0393273 A1 * | 12/2019 | Umezu .................. C09K 11/56 |
| 2022/0148997 A1 * | 5/2022 | Bourke, Jr. .............. A61N 5/06 |

FOREIGN PATENT DOCUMENTS

| KR | 10-1649573 | 8/2016 |
| KR | 10-2016-0139985 | 12/2016 |
| KR | 10-2017-0037027 | 4/2017 |
| KR | 10-2018-0093216 | 8/2018 |
| KR | 10-2019-0111637 | 10/2019 |

* cited by examiner

*Primary Examiner* — Andres Munoz
*Assistant Examiner* — Sean Ayers Winters
(74) *Attorney, Agent, or Firm* — CANTOR COLBURN LLP (57) ABSTRACT

A curable resin composition for a color filter of a display device includes, among other things: a coloring agent; and a photoinitiator; and further includes one or more particles configured to absorb light in the near-infrared region of light and configured to emit light in the ultraviolet region of light.

22 Claims, 7 Drawing Sheets

CURABLE RESIN COMPOSITION AND DISPLAY DEVICE HAVING COLOR FILTER LAYER INCLUDING SAME

CROSS-REFERENCE TO RELATED APPLICATIONS

This application claims priority from and the benefit of Korean Patent Application No. 10-2021-0036882, filed on Mar. 22, 2021, which is hereby incorporated by reference for all purposes as if fully set forth herein.

BACKGROUND

Field

Embodiments of the invention relate generally to display devices, and more particularly, to a curable resin composition and a display device including a color filter layer formed of the curable resin composition.

Discussion of the Background

Various types of display devices used for multimedia devices, such as a television set, a mobile phone, a tablet computer, a navigation system, and a game console, are being developed. In such display devices, a so-called self-luminescent display element displays images by causing an organic compound-containing or a quantum dot-containing light emitting material to emit light.

Display devices may include various optical functional layers in order to provide color images with higher quality to users, and research is being conducted to reduce reflectance of external light.

The above information disclosed in this Background section is only for understanding of the background of the inventive concepts, and, therefore, it may contain information that does not constitute prior art.

SUMMARY

Applicant discovered that, in general, during the curing process in the forming of a color filter layer in a display device, each filter has a low curing rate because light is absorbed through a coloring agent during photocuring, and in particular, the curing rate in the bottom of the filter is very low, in which case it is highly likely that the filter may have a very large undercut even after thermal curing.

However, when the filter is formed of a curable resin composition made according to the principles and illustrative embodiments of the invention, curing may be effectively performed over substantially the entire thickness, and to the inside, of the filter. Accordingly, the undercut of the filter may be reduced, and luminous efficiency characteristics may be improved.

A curable composition made according to the principles and embodiments of the invention includes upconversion particles, and may thus be used as a material for a color filter layer having a high curing rate over substantially the entire thickness, and to the inside, of the filter.

A display device made according to the principles and embodiments of the invention includes a color filter layer having reduced undercuts, and may thus exhibit increased luminous efficiency.

Additional features of the inventive concepts will be set forth in the description which follows, and in part will be apparent from the description, or may be learned by practice of the inventive concepts.

According to one aspect of the invention, a curable resin composition includes: a coloring agent; a photoinitiator; and one or more particles to absorb light in the near-infrared region and to emit light in the ultraviolet region.

The one or more particles may include upconversion particles including lanthanide atoms.

The one or more upconversion particles may include at least one of Nd, Tb, Ho, Er, Tm, and Tb.

The one or more particles may include at least one of $NaYF_4:Yb^{3+}/Er^{3+}$, $NaGdF4:Yb^{3+}/Er^{3+}$, $NaYF_4:Yb_3/Tm^{3+}$, $NaY(Mn)F_4:Yb^{3+}/Er^{3+}$, $NaGdF_4:Yb^{3+}/Er^{3+}$, and $LiYF_4:Yb^{3+}/Er^{3+}$.

The at least some of the one or more particles may include upconversion particles having a size of about 1 nm to about 100 nm.

The one or more particles may include upconversion particles in an amount of about 10 wt % or less, based on 100 wt % of a total amount of the curable resin composition.

The photoinitiator may include at least one of a benzophenone compound, an oxime ester compound, and a phosphine oxide compound.

The photoinitiator may be present in an amount of about 0.5 wt % to about 5 wt %, based on 100 wt % of a total amount of the curable resin composition.

According to another aspect of the invention, a display device includes: a display panel to generate a first light; a first layer disposed on the display panel, and including a transmitter to transmit the first light, a light controller to convert the first light into a second light, and another light controller to convert the first light into a third light; and a second layer disposed on the first layer, wherein the second layer includes: a first filter to transmit the first light; a second filter to transmit the second light; and a third filter to transmit the third light, at least one of the first to third filters including a coloring agent, a photoinitiator, and particles to absorb light in the near-infrared region and to emit light in the ultraviolet region.

The first light may be blue light; the second light may be green light; and the third light may be red light.

The display panel may include a light emitter to generate the first light and an encapsulation member disposed on the light emitter; and the display panel may further include a capping layer disposed on the encapsulation member and the light control layer.

The light controller may include a second light control unit having one or more first quantum dots to convert the first light into the second light; and the another light controller may include a third light control unit, having one or more second quantum dots to convert the first light into the third light.

The particles may include upconversion particles including lanthanide atoms.

The upconversion particles may include at least one of $NaYF_4:Yb^{3+}/Er^{3+}$, $NaGdF_4:Yb^{3+}/Er^{3+}$, $NaYF_4:Yb_3/Tm^{3+}$, $NaY(Mn)F_4:Yb^{3+}/Er^{3+}$, $NaGdF_4:Yb^{3+}/Er^{3+}$, and $LiYF_4:Yb^{3+}/Er^{3+}$.

The at least some of the particles may include upconversion particles having a size of about 1 nm to about 100 nm.

The first to third filters may each have a height of about 1 μm to about 5 μm, and the first layer may include a light conversion layer, the second layer may include a color filter layer, the light controller may include a second light control unit, and another light controller may include a third light control unit.

According to a further aspect of the invention, a display device includes: first to third pixel areas adjacent to each other when viewed in plan; a display panel including a first light emitter overlapping the first pixel area, a second light emitter overlapping the second pixel area, and a third light emitter overlapping the third pixel area; and a filter layer disposed on the display panel, and including a first filter overlapping the first pixel area, a second filter overlapping the second pixel area, and a third filter overlapping the third pixel area, wherein at least one of the first to third filters includes a photoinitiator, and particles to absorb light in the near-infrared region and to emit light in the ultraviolet region.

The first light emitter may be configured to emit a first light and may include a first light emitting element; the second light emitter may be configured to emit a second light and may include a second light emitting element; and the third light emitter may be configured to emit a third light and may include a third light emitting element.

The particles may include upconversion particles including lanthanide atoms.

The upconversion particles may include at least one of Nd, Tb, Ho, Er, Tm, and Tb.

It is to be understood that both the foregoing general description and the following detailed description are illustrative and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, portions, plates, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements, and duplicative explanations are omitted to avoid redundancy.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, the term "atom" may mean an element or its corresponding radical bonded to one or more other atoms.

Hereinafter, a curable composition and a display device made according to an embodiment of the invention will be described with reference to the accompanying drawings.

Figure 1:
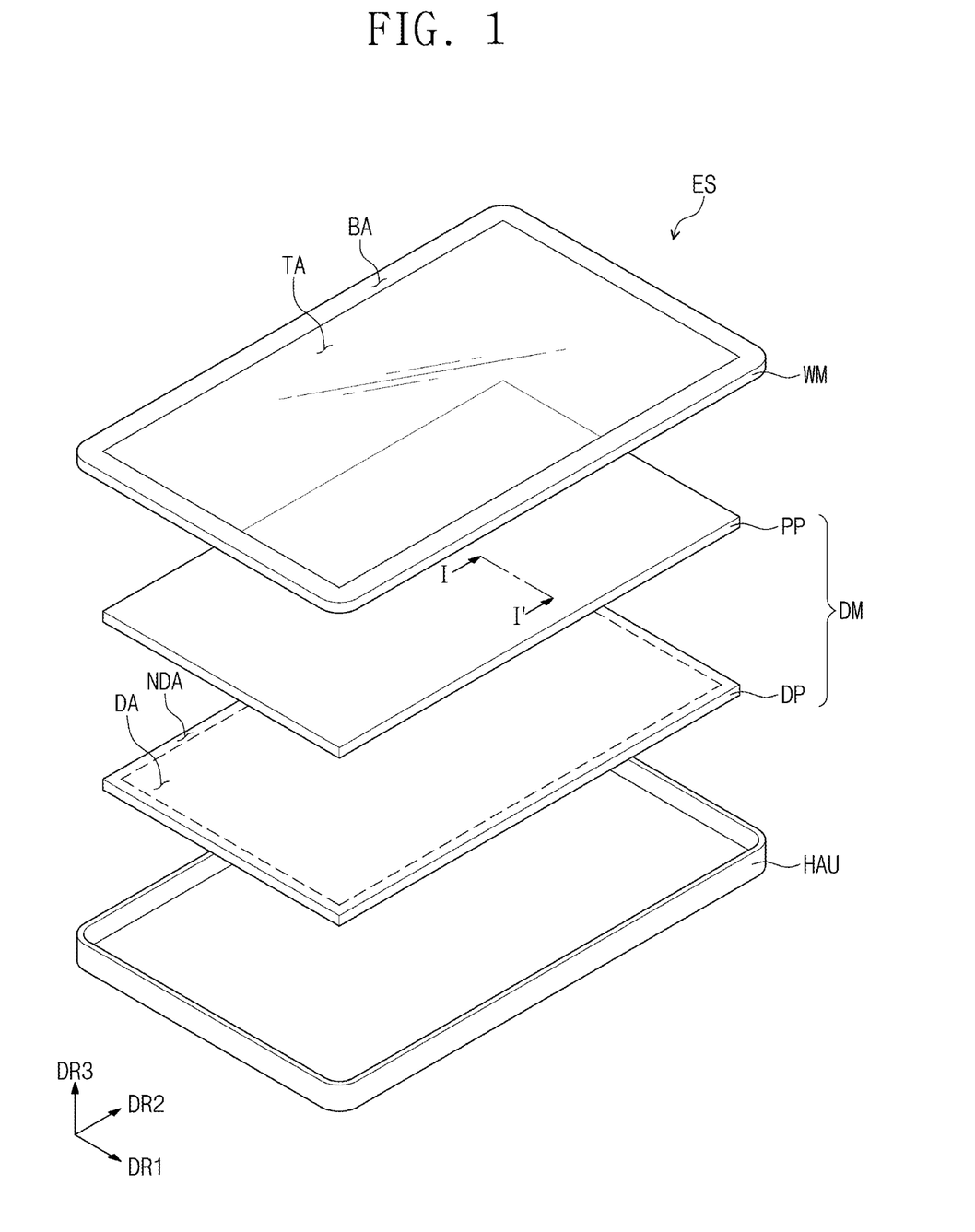
FIG. 1 is an exploded, perspective view of an embodiment of a display device constructed according to the principles of the invention.
Figure 2:
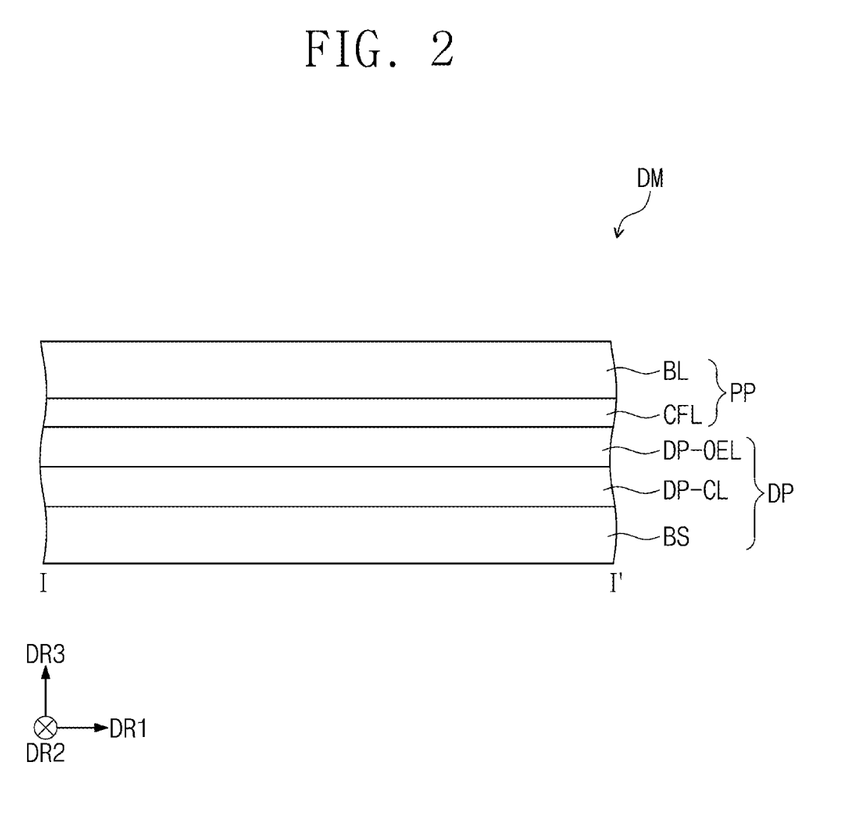
FIG. 2 is a cross-sectional view of an embodiment of a display module taken along line I-I' of FIG. 1.

FIG. 1 is an exploded, perspective view of an embodiment of a display device constructed according to the principles of the invention. FIG. 2 is a cross-sectional view of an embodiment of a display module taken along line I-I' of FIG. 1.

In an embodiment, the display device ES may be a portable electronic device. In addition, the display device ES may not only be used for large-sized electronic devices such as a television set, a monitor, or an outdoor billboard but also used for small- and medium-sized electronic devices such as a personal computer, a laptop computer, a personal digital terminal, a car navigation unit, a game console, a smartphone, a tablet, and a camera. In addition, these devices are merely presented as examples, and the display device may take the form of or be adopted for other electronic devices.

The display device ES may display images through a front surface. The images may include still images as well as dynamic images. The front surface of the display device ES may have a substantially flat shape or may have a substantially curved shape.

The display device ES may be generally flexible. This indicates a property of being bendable, and may include all flexible structures ranging from those being completely foldable to a structure being bendable up to several nanometers. For example, the display device ES may be a substantially curved display device or a foldable display device. However, the embodiments of the invention are not limited thereto, and the display device ES may be substantially rigid.

The display device ES may include a window WM, a display module DM, and a housing HAU. The display module DM may include a display panel DP, which is a display element. The display device ES may include various types of elements activated in response to electrical signals, such as a touch element or a detection element in addition to a display element.

The third direction DR3 is defined as a direction in which images are provided to users. In addition, the first direction DR1 and the second direction DR2 may be perpendicular to each other, and the third direction DR3 may be a normal direction to a plane defined by the first direction DR1 and the second direction DR2. In FIG. 1, the plane defined by the first direction DR1 and the second direction DR2 may be a display surface on which images are provided. The thickness direction of the display device ES is indicated by the third direction DR3. A front surface (or an upper surface) and a rear surface (or a lower surface) of respective members are defined by the third direction DR3. However, directions indicated by the first to third directions DR1, DR2, and DR3 are relative concepts, and may thus be changed to other directions. Hereinafter, first to third directions correspond to directions indicated by the first to third directions DR1, DR2, and DR3, respectively, and are given the same reference numerals.

The display device ES may have a generally hexahedral shape having a thickness in the third direction DR3 on the plane defined by the first direction DR1 and the second direction DR2 intersecting each other. However, this shape is presented as an example, and the display device ES may have various shapes and is not limited to any one embodiment.

In the display device ES, the window WM may be disposed on the display module DM. The window WM may be a material including a glass, a sapphire, or a plastic. The window WM includes a transmission area TA transmitting images provided from the display module DM, and a bezel area BA that is adjacent to the transmission area TA and does not transmit images. In the display device ES of another embodiment, the window WM may be omitted.

The transmission area TA may be a substantially optically transparent area. The bezel area BA may have a relatively lower light transmittance than the transmission area TA. The bezel area BA may have a predetermined color. The bezel area BZA may surround the transmission area TA. The bezel area BA may define the shape of the transmission area TA. However, the embodiments of the invention are not limited to the one shown, and the bezel area BA may be disposed adjacent to only one side of the transmission area TA, and a portion thereof may be omitted.

In the display device ES, the display module DM may be disposed below the window WM. The display module DM may include the display panel DP and the light control layer PP disposed on the display panel DP.

The display panel DP may be a light emitting display panel. For example, the display panel DP may be an organic light emitting display panel, a quantum dot light emitting display panel, a micro LED display panel, or a nano LED display panel. An emission layer of the organic light emitting display panel may include an organic light emitting material. An emission layer of the quantum dot light emitting display panel may include one or more quantum dots and/or quantum rods. The micro LED display panel may include a micro light emitting diode element, which is a subminiature light emitting element, and the nano LED display panel may include a nano light emitting diode element.

The display device ES may be an organic light emitting display device including an organic light emitting display panel. One planar surface of the display panel DP on which images are displayed is defined as a display surface. The display surface includes a display area DA in which images are displayed and a non-display area NDA in which images are not displayed. The display area DA is defined in the center of the display panel DP when viewed in plan, and may thus overlap the transmission area TA of the window WM.

Figure 5:
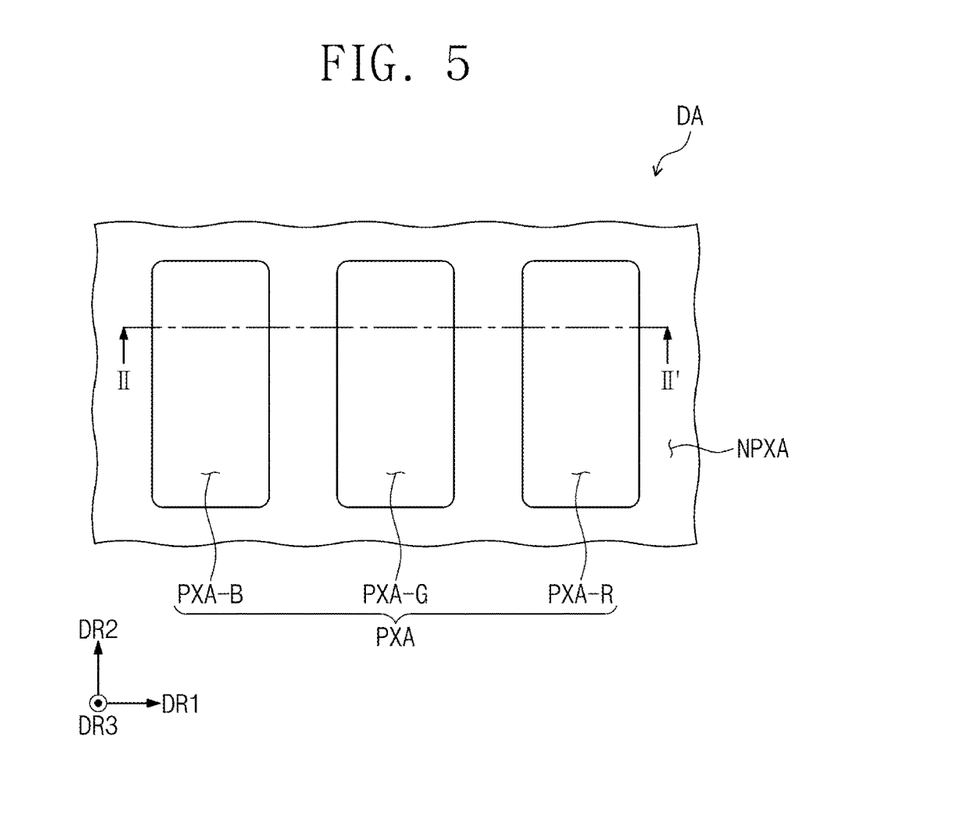
FIG. 5 is an enlarged plan view illustrating an embodiment of a portion of a display area shown in FIG. 1.

The display panel DP may include a plurality of pixels in the area corresponding to the display area DA of the display device ES. The plurality of pixels may be spaced apart from each other in the display area DA. The plurality of pixels output light having color information in response to electrical signals, and may thus display images on the display area DA. The plurality of pixels may correspond to pixel areas PXA (FIG. 5).

The display device ES may further include the housing HAU. The housing HAU may be disposed below the display module DM and accommodate the display module DM. The housing HAU may cover the display module DM such that an upper surface, which is the display surface of the module DM is exposed. The housing HAU may cover a side surface and a bottom surface of the display module DM, and expose the whole upper surface.

Referring to FIG. 2, the display panel DP may include a base substrate BS, a circuit layer DP-CL provided on the base substrate BS, and a display element layer DP-OEL. In an embodiment, the base substrate BS, the circuit layer DP-CL, and the display element layer DP-OEL may be sequentially stacked in the third direction DR3.

The base substrate BS may be a member providing a base surface on which the display element layer DP-OEL is disposed. The base substrate BS may be a glass substrate, a metal substrate, a plastic substrate, etc. However, the embodiments are not limited thereto, and the base substrate BS may be an inorganic layer, an organic layer, or a composite material layer. The base substrate BS may be a flexible substrate that may be readily bent or folded.

In an embodiment, the circuit layer DP-CL may be disposed on the base substrate BS, and the circuit layer DP-CL may include a plurality of transistors. The transistors each may include a control electrode, an input electrode, and an output electrode. For example, the circuit layer DP-CL may include a switching transistor and a driving transistor for driving a light emitter, which may be in the form of a light emitting element ED-1 (FIG. 6) of the display element layer DP-OEL.

The light control layer PP is disposed on the display panel DP. The light control layer PP may include a second layer or filter layer in the form of a color filter layer CFL and a base layer BL. The color filter layer CFL may reduce reflection of external light and prevent color mixture. However, the base layer BL may be omitted. The light control layer PP will be described in more detail with reference to FIG. 3. The light control layer PP may not include a polarizing layer.

Figure 3:
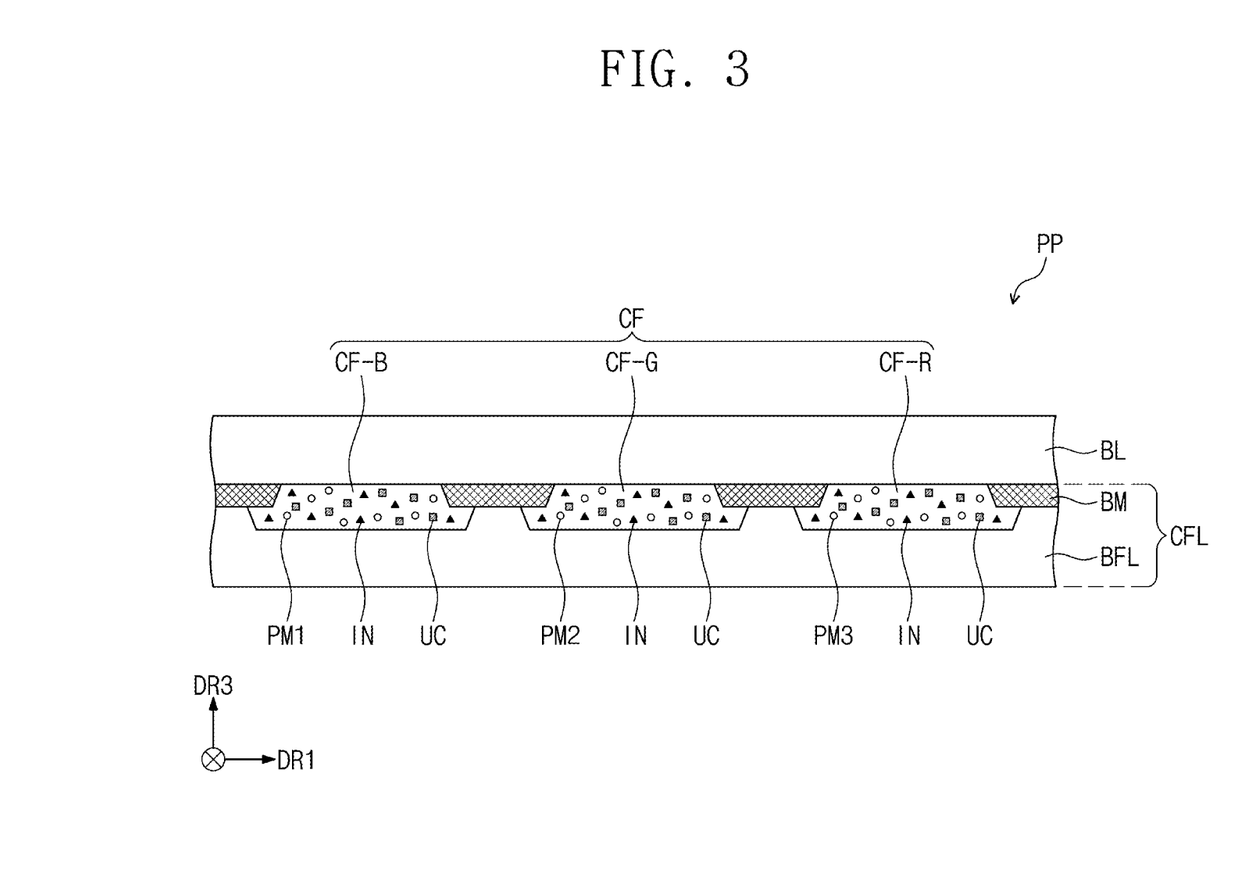
FIG. 3 is a cross-sectional view of an embodiment of the light control layer of FIG. 2.

FIG. 3 is a cross-sectional view of an embodiment of the light control layer of FIG. 2.

The light control layer PP includes a color filter layer CFL including a color filter unit CF. The light control layer PP may further include a base layer BL disposed on the color filter layer CFL, and may further include a buffer layer BFL disposed below the color filter layer CFL. However, the embodiments are not limited thereto, and the buffer layer BFL and/or the base layer BL may be omitted.

The buffer layer BFL may be a protection layer protecting the color filter unit CF. The buffer layer BFL may be an inorganic material layer containing at least one inorganic material among a silicon nitride, a silicon oxide, and a silicon oxynitride. The buffer layer BFL may be formed of a single layer or a plurality of layers.

The base layer BL may be a member providing a base surface on which the color filter layer CFL is disposed. The base layer BL may be a glass substrate, a metal substrate, a plastic substrate, etc. However, the embodiments are not limited thereto, and the base layer BL may be an inorganic layer, an organic layer, or a composite material layer.

The color filter layer CFL may be disposed below the base layer BL. The color filter layer CFL may reduce reflectance of external light of the display device ES, and may increase light output efficiency. The color filter layer CFL may be patterned and formed below the base layer BL. The color filter layer CFL may include a light blocking unit BM and a color filter unit CF. The color filter unit CF may include a plurality of filters CF-B, CF-G, and CF-R. Each of the filters CF-B, CF-G, and CF-R may transmit light in some wavelength ranges and absorb light in the other some wavelength ranges. In an embodiment, the first filter CF-B may transmit first light and block second light and third light. The second filter CF-G may transmit the second light and block the first light and the third light. In an embodiment, the third filter CF-R may transmit the third light and block the first light and the second light. For example, the first filter CF-B may be a blue filter, the second filter CF-G may be a green filter, and the third filter CF-R may be a red filter.

The light blocking unit BM may be a black matrix. The light blocking unit BM may be formed from an organic light blocking material or an inorganic light blocking material, both including a black pigment or a black dye. The light blocking unit BM may prevent light leakage, and separate boundaries between the adjacent filters CF-B, CF-G, and CF-R.

Figure 7:
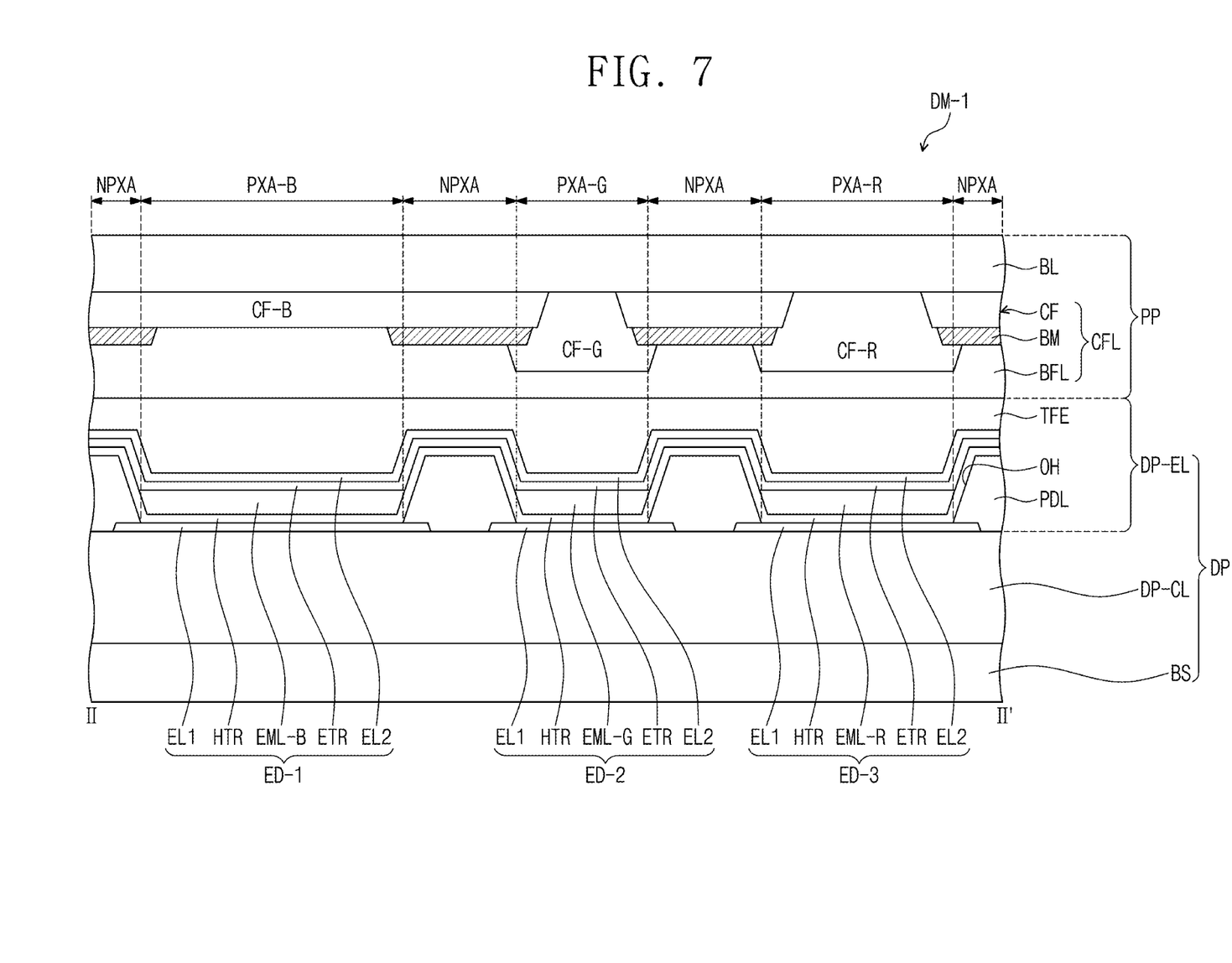
FIG. 7 is a cross-sectional view of another embodiment of a display module constructed according to the principles of the invention.

In an embodiment shown in FIG. 3, the first color filter CF-B of the color filter layer CFL does not overlap the second filter CF-G or the third filter CF-R, which are defined by the light blocking unit BM as the boundary therebetween, but the embodiments are not limited thereto. For example, as shown in FIG. 7, the first filter CF-B may overlap the second filter CF-G and/or the third filter CF-R.

Each of the filters CF-B, CF-G, and CF-R may be formed of a curable resin composition made according to the principles and an embodiment of the invention. The curable resin composition may be used to form a color filter layer. The curable resin composition may include coloring agents PM1, PM2, and PM3, particles that exhibit photon upconversion such as upconversion particles UC, and a photoinitiator IN. The curable resin composition may further include a polymer photosensitive resin.

The curable resin composition may include coloring agents PM1, PM2, and PM3. The coloring agents PM1, PM2, and PM3 may include at least one pigment, at least one dye, or a mixture thereof. The pigment and the dye may be materials generally used in the art according to the type of filters desired. For example, the first coloring agent PM1 included in the curable resin composition forming the first filter CF-B may include a blue pigment or a blue dye, the second coloring agent PM2 included in the curable resin composition forming the second filter CF-G may include a green pigment or a green dye, and the third coloring agent PM3 included in the curable resin composition forming the third filter CF-R may include a red pigment or a red dye. The coloring agents PM1, PM2, and PM3 may be included in the amount of about 0.1 weight percent (wt %) to about 50 wt %, preferably about 0.3 wt % to about 40 wt %, with respect to 100 wt % of the total amount of the curable resin composition. The curable resin composition may include upconversion particles UC. As used herein, upconversion particles UC refer to particles capable of absorbing light in the near-infrared region and emitting light in the ultraviolet region. The upconversion particles UC may contain lanthanide atoms. The upconversion particles UC may include at least one among Nd, Tb, Ho, Er, Tm, and Tb. For example, the upconversion particles UC may contain at least one among $NaYF_4:Yb^{3+}/Er^{3+}$, $NaGdF_4:Yb^{3+}/Er^{3+}$, $NaYF_4:Yb_3/Tm^{3+}$, $NaY(Mn)F_4:Yb^{3+}/Er^{3+}$, $NaGdF_4:Yb^{3+}/Er^{3+}$, and $LiYF_4:Yb^{3+}/Er^{3+}$.

The upconversion particles UC may be generally nano-sized particles. For example, the upconversion particles UC may have a size of about 1 nanometer (nm) to about 100 nm. The upconversion particles UC may be included in less than about 10 wt %. In another embodiment, the upconversion particles UC may be included about 0.1 wt % to about 10 wt %, preferably about 0.3 wt % to about 5 wt %.

The curable resin composition may include a photoinitiator IN. The photoinitiator IN is not particularly limited as long as it is capable of curing compositions through ultraviolet rays. For example, the photoinitiator IN may include any one among a benzophenone compound, such as a benzophenone-based compound, an oxime ester compound, such as an oxime ester-based compound, and a phosphine oxide compound, such as a phosphine oxide-based compound. The photoinitiator IN may be included in the amount of about 0.3 wt % to about 5 wt %.

Each of the filters CF-B, CF-G, and CF-R may be patterned and formed by applying a curable resin composition on the base layer BL and then performing photocuring and thermal curing. The thermal curing is performed at a low temperature of about 85° C., and, in the photocuring process, curing may need to be performed to the bottom of the filters CF-B, CF-G, and CF-R, for example, to a region close to the base layer BL along the third direction DR3. Continuing the curing reaction through the photoinitiator IN requires supply of ultraviolet rays. However, in the photocuring process through ultraviolet rays, the coloring agents PM1, PM2, and PM3 included in the curable resin composition may absorb ultraviolet rays to prevent ultraviolet rays from reaching the bottom of the filters CF-B, CF-G, and CF-R. Accordingly, the closer to the base layer BL in the third direction DR3, the lower the curing rate of the filters CF-B, CF-G, and CF-R, and a high undercut may be caused. The undercut is formed because curing does not occur across the entire thickness of the filters.

The curable resin composition may prevent the coloring agents PM1, PM2, and PM3 from absorbing light using the photocuring by infrared rays, which may allow light to reach the bottom of the filters CF-B, CF-G, and CF-R. In addition, when the upconversion particles UC absorb the supplied infrared rays and emit the ultraviolet rays, the curing reaction may occur through the photoinitiator IN. Thus, when the curable resin composition includes the upconversion particles UC, a high curing rate over substantially the thickness, and to the inside, of the filters CF-B, CF-G, and CF-R may be achieved, thereby reducing undercuts.

Figure 4:
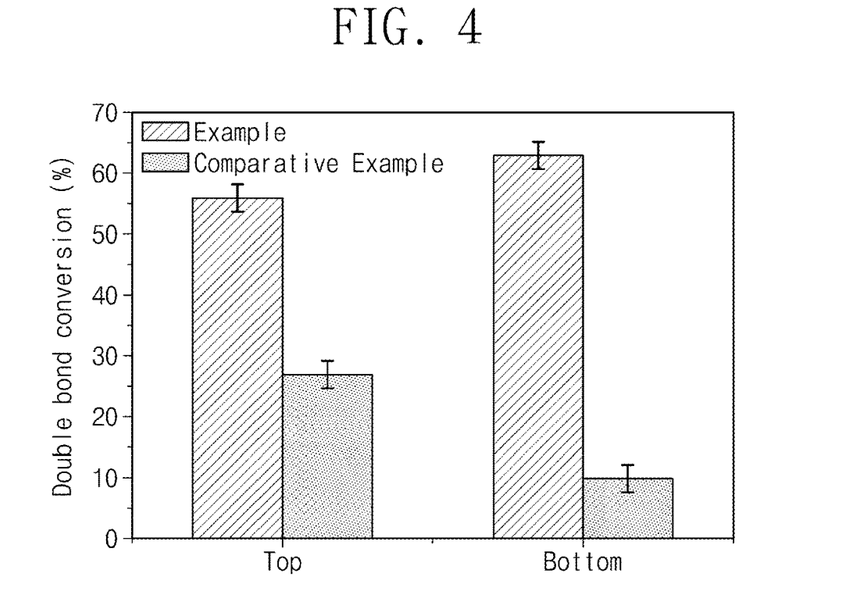
FIG. 4 is a graphical depiction illustrating double bond conversion of a color filter of Examples constructed according to the principles of the invention and Comparative Examples.

FIG. 4 is a graphical depiction illustrating double bond conversion of a color filter of Examples constructed according to the principles of the invention and Comparative Examples.

EXAMPLES

Examples are filters formed of the curable resin composition made according to the principles of and an embodiment of the invention, and Comparative Examples are filters formed of the curable resin composition having the same composition but excluding upconversion particles. Specifically, Examples include 0.5 wt % of a coloring agent, 0.7 wt % of a curing agent sold under the trade designation Irgacure 784 by BASF SE Company, of Ludwigshafen, Federal Republic of Germany, and 0.6 wt % of upconversion particles ($NaYF_4:Yb_3/Tm^{3+}$), and Comparative Examples, on the other hand, include 0.5 wt % of a coloring agent, and 0.7 wt % of Irgacure 784. The color filters of Examples were cured through infrared rays, and the color filters of Comparative Examples were cured through ultraviolet rays. The axis y indicates curing rates (double bond conversion, %).

Referring to FIG. 4, even when Examples include the same coloring agent, infrared rays supplied by the upconversion particles are converted into ultraviolet rays, and the converted rays are transmitted to an initiator to allow a curing reaction. Accordingly, both the surface (top) to which light is supplied and the bottom farthest from the surface to which light is supplied have high curing rates. On the other hand, in Comparative Examples, ultraviolet rays supplied are absorbed through the coloring agent, which leads to curing performed only on the surface to which light is supplied, thereby resulting in low curing rates in the bottom.

Figure 6:
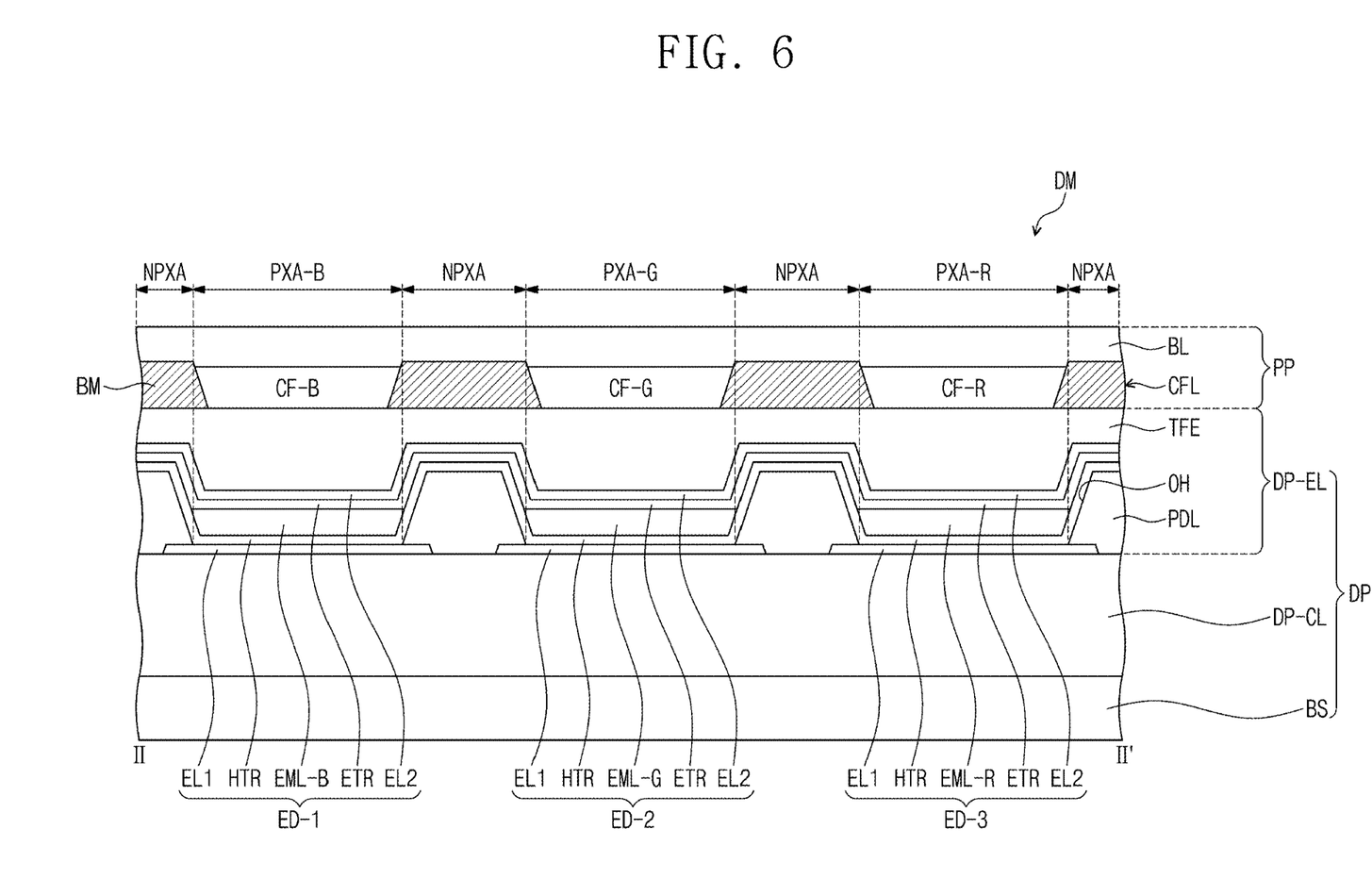
FIG. 6 shows a cross-sectional view of an embodiment of a display module taken along line II-II' of FIG. 5.

FIG. 5 is an enlarged plan view illustrating an embodiment of a portion of a display area shown in FIG. 1. FIG. 6 shows a cross-sectional view of an embodiment of a display module taken along line II-II' of FIG. 5. FIG. 7 is a cross-sectional view of another embodiment of a display module constructed according to the principles of the invention. In the descriptions of FIGS. 1 to 7, the same descriptions of the elements described above in FIGS. 1 to 4 will not be repeated, and differences will be mainly described.

The display area DA may include pixel areas PXA and peripheral areas NPXA adjacent to the pixel areas PXA.

FIG. 5 mainly shows three pixel areas PXA-B, PXA-G, and PXA-R. The three pixel areas PXA-B, PXA-G, and PXA-R shown in FIG. 5 may be repeatedly disposed over substantially the entire display area DA. The peripheral areas NPXA may set boundaries between the first to third pixel areas PXA-B, PXA-G, and PXA-R to prevent the first to third pixel areas PXA-B, PXA-G, and PXA-R from being color mixed.

In an embodiment, first to third pixel areas PXA-B, PXA-G, and PXA-R having substantially the same planar area are shown, but embodiments are not limited thereto. The first to third pixel areas PXA-B, PXA-G, and PXA-R may have a different planar area or only some of the first to third pixel areas PXA-B, PXA-G, and PXA-R may have a different planar area. The shapes of the first to third pixel areas PXA-B, PXA-G, and PXA-R are not limited to the generally rectangular shape shown and may, e.g., have a generally polygonal shape. In this case, the area may refer to an area when viewed in a plane defined by the first direction DR1 and the second direction DR2.

Each of the first to third pixel areas PXA-B, PXA-G, and PXA-R may correspond to pixels. Each of the first to third pixel areas PXA-B, PXA-G, and PXA-R may provide different color light in response to electrical signals. Accordingly, a plurality of pixels PX corresponding to each of the first to third pixel areas PXA-B, PXA-G, and PXA-R may output light having color information.

One of the first to third pixel areas PXA-B, PXA-G, and PXA-R may provide first light to users, another may provide second light different from the first light, and the other may provide third light different from the first light and the second light. In an embodiment, the first pixel area PXA-B may provide blue light, the second pixel area PXA-G may provide green light, and the third pixel area PXA-R may provide red light. The green light may be light having a wavelength of about 495 nm to about 570 nm, but is not limited thereto and may include wavelength ranges that may be considered green. The red light may be light having a wavelength of about 620 nm to about 750 nm, but is not limited thereto and may include wavelength ranges that may be considered red. The display module DM may include a display panel DP having a plurality of light emitting elements ED-1, ED-2, and ED-3, and a light control layer PP disposed on the display panel DP. The display panel DP may include a base substrate BS, a circuit layer DP-CL and a display element layer DP-EL provided on the base substrate BS, and the display element layer DP-EL may include pixel defining films PDL, light emitting elements ED-1, ED-2 and ED-3 disposed between the pixel defining films PDL, and an encapsulation layer TFE disposed on the light emitting elements ED-1, ED-2 and ED-3.

Referring to FIGS. 5 to 7, the pixel areas PXA-B, PXA-G, and PXA-R each may be the area emitting light generated from each of the light emitting elements ED-1, ED-2, and ED-3. The pixel areas PXA-B, PXA-G, and PXA-R may be spaced apart from one another when viewed in plan. The plurality of light emitting elements ED-1, ED-2, and ED-3 may emit light having different wavelength ranges. For example, in an embodiment, the display module DM may include a first light emitter in the form of a first light emitting element ED-1 emitting blue light, a second light emitter in the form of a second light emitting element ED-2 emitting green light, and a third light emitter in the form of a third light emitting element ED-3 emitting red light. However, the embodiments of the invention are not limited thereto, and the first to third light emitting elements ED-1, ED-2 and ED-3 may emit light in the same wavelength range or emit light in at least one different wavelength range.

For example, the first pixel area PXA-B, the second pixel area PXA-G, and the third pixel area PXA-R of the display module DM may correspond to the first light emitting element ED-1, the second light emitting element ED-2, and the third light emitting element ED-3, respectively. The light emitting elements ED-1, ED-2, and ED-3 may have substantially the same structure. However, in the light emitting elements ED-1, ED-2, and ED-3, emission layers EML-B, EML-G, and EML-R may include different light emitting materials.

Hereinafter, the first light emitting element ED-1 will be described as an example of the light emitting element. The light emitting element ED-1 includes a first electrode EL1, a second electrode EL2 facing the first electrode EL1, and a plurality of functional layers disposed between the first electrode EL1 and the second electrode EL2 and having an emission layer EML-B.

The plurality of functional layers may include a hole transport region HTR disposed between the first electrode EL1 and the emission layer EML, and an electron transport region ETR disposed between the second electrode EL2 and the emission layer EML-B. In an embodiment, a capping layer may be further disposed on the second electrode EL2.

The hole transport region HTR and the electron transport region ETR each may include a plurality of sub functional layers. For example, the hole transport region HTR may include a hole injection layer and a hole transport layer as a sub functional layer, and the electron transport region ETR may include an electron injection layer and an electron transport layer as a sub functional layer. The hole transport region HTR may further include an electron blocking layer as a sub functional layer, and the electron transport region ETR may further include a hole blocking layer as a sub functional layer.

In the light emitting diode ED-, the first electrode EL1 has conductivity. The first electrode EL1 may be formed of a metal alloy or a conductive compound. The first electrode EL1 may be an anode. The first electrode EL1 may be a pixel electrode.

In the light emitting element ED-1, the first electrode EL1 may be an anode or a cathode, although embodiments are not limited thereto. In addition, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide such as an indium tin oxide (ITO), an indium zinc oxide (IZO), a zinc oxide (ZnO), and an indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). Alternatively, the first electrode EL1 may have a multilayer structure including a reflective film or a transflective film formed of the above-described materials, and a transparent conductive film formed of an indium tin oxide (ITO), an indium zinc oxide (IZO), a zinc oxide (ZnO), an indium tin zinc oxide (ITZO), etc. For example, the first electrode EL1 may be a multilayer metal film and may have a structure in which metal films of an ITO/Ag/ITO are stacked. The first electrode EL1 may have a thickness of about 700 Å to about 10,000 Å. For example, the first electrode EL1 may have a thickness of 1000 Å to about 3000 Å.

The hole transport region HTR is provided on the first electrode EL1. The hole transport region HTR may include a hole injection layer, a hole transport layer, etc. In addition, the hole transport region HTR may further include at least one of a hole buffer layer or an electron blocking layer in addition to the hole injection layer and the hole transport layer. The hole buffer layer may compensate for a resonance distance according to the wavelength of light emitted from an emission layer EML, and may thus increase luminous efficiency. Materials which may be included in the hole transport region HTR may be used as materials included in the hole buffer layer. The electron blocking layer is a layer that serves to prevent electrons from being injected from the electron transport region ETR to the hole transport region HTR.

The hole transport region HTR may have a single layer formed of a single material, a single layer formed of a plurality of different materials, or a multilayer structure having a plurality of layers formed of a plurality of different materials. For example, the hole transport region HTR may have a single-layer structure formed of a plurality of different materials, or a structure in which a hole injection layer/hole transport layer, a hole injection layer/hole transport layer/hole buffer layer, a hole injection layer/hole buffer layer, a hole transport layer/hole buffer layer, or a hole injection layer/hole transport layer/electron blocking layer are stacked in order from the first electrode ELL but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer, for example, may include a phthalocyanine compound such as copper phthalocyanine, N,N-diphenyl-N,N-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4',4'-tris (N,N-diphenylamino)triphenylamine (TDATA), 4,4',4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f:2',3'-h]quinoxaline-2,3,6,7,10,11-hexacarbonitrile (HAT-CN), etc.

For example, the hole transport layer may include carbazole-based derivatives such as N-phenyl carbazole and polyvinyl carbazole, fluorene-based derivatives, N,N'-bis(3-methylphenyl)-N,N-diphenyl-[1,1-biphenyl]-4,4'-diamine (TPD), triphenylamine-based derivatives such as 4,4',4"-tris (N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenylThenzenamine] (TAPC), 4,4'-bis[N,N-(3-tolyl)amino]-3,3'-dimethylbiphenyl (HMTPD), 1,3-bis(N-carbazolyl)benzene (mCP), etc.

The emission layer EML-B is provided on the hole transport region HTR. The emission layer EML-B may include an organic light emitting material, an inorganic light emitting material, or the like, and may include a micro-scale or a nano-scale light emitting body. In the light emitting element ED-1, the emission layer EML-B may include a host and a dopant. The light emitting element ED-1 may generate specific light by recombining holes and electrons injected from the first electrode EL1 and the second electrode EL2 in the emission layer EML-B.

In an embodiment, the emission layer EML-B may include one or more quantum dots. In an embodiment, the quantum dots may include a core and a shell surrounding the core. The quantum dots may have a single-layer structure composed of only a core, although embodiments are not limited thereto. The shell of the quantum dot having a core-shell structure may serve as a protection layer to prevent the chemical deformation of the core so as to maintain semiconductor properties, and/or a charging layer to impart electrophoresis properties to the quantum dot. The shell may be a single layer or multiple layers. An interface between the core and the shell may have a concentration gradient in which the concentration of an element present in the shell becomes lower towards the center.

The quantum dots may be a semiconductor nanocrystal that may be selected from a compound of Groups II-VI, a compound of Groups III-V, a compound of Groups IV-VI, an element of Group IV, a compound of Group IV, and a combination thereof.

The compound of Groups II-VI may be selected from the group consisting of a binary compound selected from the group consisting of CdSe, CdTe, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof.

The compound of Groups III-VI may include a binary compound such as $In_2S_3$ and $In_2Se_3$, a ternary compound such as $InGaS_3$ and $InGaSe_3$, or any combination thereof.

The compound of Groups III-V may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The semiconductor compound of Groups III-V may further include a metal of Group II (e.g., InZnP, etc.).

The compound of Groups IV-VI may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The element of Group IV may be selected from the group consisting of Si, Ge, and a mixture thereof. The compound of Group IV may be a binary compound selected from the group consisting of SiC, SiGe, and a mixture thereof.

The semiconductor compound of Groups I, III, and VI may include a ternary compound selected from the group consisting of AgInS, $AgInS_2$, CuInS, $CuInS_2$, $CuGaO_2$, $AgGaO_2$, $AgAlO_2$, etc., or any combination thereof.

In this case, a binary compound, a ternary compound, or a quaternary compound may be present in particles in a uniform concentration distribution, or may be present in the same particles in a partially different concentration distribution. In addition, a core/shell structure in which one quantum dot surrounds another quantum dot may be present. An interface between the core and the shell may have a concentration gradient in which the concentration of an element present in the shell becomes lower towards the center.

In the quantum dots of an embodiment, the shell may be formed of a metal or a non-metal oxide, a semiconductor compound, or a combination thereof. For example, the metal or the non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, and $CoMn_2O_4$, but the embodiments are not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiments of the invention are not limited thereto.

The quantum dot may have a full width of half maximum (FWHM) of a light emitting wavelength spectrum of about 45 nm or less, preferably about 40 nm or less, more preferably about 30 nm or less, and color purity or color reproducibility may be enhanced in the above ranges. In addition, light emitted through such a quantum dot is emitted in all directions, and thus a wide viewing angle may be improved.

In addition, although the form of a quantum dot is not particularly limited as long as it is a form commonly used in the art, and more specifically, a quantum dot in the form of generally spherical, generally pyramidal, generally multi-armed, or generally cubic nanoparticles, or generally nanotube-shaped, generally nanowire-shaped, generally nanofiber-shaped, or generally nanoplatelet-shaped, etc. may be used.

The quantum dot may control the color of emitted light according to particle size thereof, and thus a quantum dot QD may have various colors of emitted light such as blue, red, green, etc. The smaller the particle size of the quantum dot QD becomes, light in the short wavelength region may be emitted. For example, in the quantum dot QD having the same core, the particle size of the quantum dot emitting green light may be smaller than the particle size of the quantum dot emitting red light. In addition, in the quantum dot QD having the same core, the particle size of the quantum dot emitting blue light may be smaller than the particle size of the quantum dot emitting green light. However, the embodiments of the invention are not limited thereto, and even in the quantum dot QD having the same core, the particle size may be adjusted according forming-materials and thickness of a shell.

When the quantum dot QD have various light emission colors such as blue, red, green, etc., the quantum dot QD having different light emission colors may have different core materials. The emission layer EML-B may have, for example, a thickness of about 5 nm to about 20 nm or about 10 nm to about 20 nm.

The emission layer EML-B may be formed using various methods such as a vacuum deposition method, a spin coating method, a cast method, a Langmuir-Blodgett (LB) method, an inkjet printing method, a laser printing method, and a laser induced thermal imaging (LITI) method. For example, the emission layer EML-B may be formed by providing the quantum dot composition through inkjet printing. The electron transport region ETR is provided on the emission layer EML-B. The electron transport region ETR may include at least one among a hole blocking layer, an electron transport layer, and an electron injection layer, but the embodiments of the invention are not limited thereto.

The electron transport region ETR may have a single layer formed of a single material, a single layer formed of a plurality of different materials, or a multilayer structure having a plurality of layers formed of a plurality of different materials. For example, the electron transport region ETR may have a single layer structure of an electron injection layer or an electron transport layer, and may have a single layer structure formed of an electron injection material and an electron transport material. In addition, the electron transport region ETR may have a single layer structure formed of a plurality of different materials, or may have a structure in which an electron transport layer/electron injection layer, or a hole blocking layer/electron transport layer/electron injection layer are stacked in order from the emission layer EML-B, but is not limited thereto. The electron transport region ETR may have a thickness of, for example, about 200 Å to about 1500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include an anthracene-based compound. However, the embodiments of the invention are not limited thereto, and the electron transport region ETR may include, for example, tris(8-hydroxyquinolinato)aluminum ($Alq_3$), 1,3,5-tri[(3-pyridyl)-phen-3-yl] benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq$_2$), 9,10-di(naphthalene-2-yl)anthracene (ADN), or a mixture thereof. The electron transport layers may have a thickness of about 100 Å to about 1000 Å, for example, about 150 Å to about 500 Å. When the thicknesses of the electron transport layers satisfy the above-described range, satisfactory electron transport properties may be obtained without a substantial increase in driving voltage.

The electron transport region ETR may include halogenated metals, lanthanide metals, co-deposition materials of a halogenated metal and a lanthanide metal, etc. The halogenated metal may be an alkali metal halide. For example, the electron transport region ETR may include LiF, lithium quinolate (Liq), $Li_2O$, BaO, NaCl, CsF, Yb, RbCl, RbI, KI, or KI: Yb, but the embodiments of the invention are not limited thereto. The electron injection layer may also be formed of a mixture material of an electron transport material and an insulating organo-metal salt. For example, the organo-metal salt may include, for example, metal acetates, metal benzoates, metal acetoacetates, metal acetylacetonates, or metal stearates. The electron injection layers may have a thickness of about 1 Å to about 100 Å, for example, about 3 Å to about 90 Å. When the thicknesses of the electron injection layers satisfy the above-described range, satisfactory electron injection properties may be obtained without a substantial increase in driving voltage.

The second electrode EL2 is provided on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may be formed of a transparent metal oxide, for example, an indium tin oxide (ITO), an indium zinc oxide (IZO), a zinc oxide (ZnO), an indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound containing thereof (e.g., AgYb, a compound of AgMg and MgAg, etc. according to amount) or a mixture containing thereof (e.g., a mixture of Ag and Mg, a mixture of Ag and Yb, etc.). Alternatively, the first electrode EL1 may have a multilayer structure including a reflective film or a transflective film formed of the above-described materials, and a transparent conductive film formed of an indium tin oxide (ITO), an indium zinc oxide (IZO), a zinc oxide (ZnO), an indium tin zinc oxide (ITZO), etc.

The second electrode EL2 may be connected with an auxiliary electrode. When the second electrode EL2 is connected with the auxiliary electrode, the resistance of the second electrode EL2 may decrease. In an embodiment, pixel areas PXA-B, PXA-G and PXA-R may have different planar areas according to the color emitted from the emission layers EML-B, EL-G and EL-R of the light emitting elements ED-1, ED-2 and ED-3. For example, the first pixel area PXA-B corresponding to the first light emitting element ED-1 emitting blue light may have a largest area, and the second pixel area PXA-G corresponding to the second light emitting element ED-2 generating green light may have a smallest area. However, the embodiments of the invention are not limited thereto.

Each of the pixel areas PXA-R, PXA-G, and PXA-B may be the area separated by the pixel defining films PDL. The peripheral areas NPXA may be areas between neighboring pixel areas PXA-B, PXA-G and PXA-R, and may correspond to the pixel defining films PDL. The pixel defining films PDL may separate the light emitting elements ED-1, ED-2 and ED-3. The emission layers EML-B, EML-G, and EML-R of the light emitting elements ED-1, ED-2 and ED-3 may be disposed and separated in openings OH defined by the pixel defining films PDL.

The pixel defining films PDL may be formed of a polymer resin. For example, the pixel defining films PDL may be formed including a polyacrylate-based resin or a polyimide-based resin. In addition, the pixel defining films PDL may be formed by further including an inorganic material in addition to the polymer resin. The pixel defining films PDL may be formed including a light absorbing material, or may be formed including a black pigment or a black dye. The pixel defining films PDL formed including a black pigment or a black dye may implement a black pixel defining film. When forming the pixel defining films PDL, a carbon black may be used as a black pigment or a black dye, but the embodiments of the invention are not limited thereto.

In addition, the pixel defining films PDL may be formed of an inorganic material. For example, the pixel defining films PDL may be formed including a silicon nitride ($SiN_x$), a silicon oxide ($SiO_x$), a silicon oxide ($SiO_xN_y$), etc. An encapsulation layer TFE may cover the light emitting elements ED-1, ED-2 and ED-3. The encapsulation layer TFE may be a single layer or a laminated layer of a plurality of layers. The encapsulation layer TFE may be a thin film encapsulation layer. The encapsulation layer TFE may be disposed on the light emitting elements ED-1, ED-2, and ED-3 and seal the light emitting elements ED-1, ED-2, and ED-3. The encapsulation layer TFE may cover an upper surface of the second electrode EL2 disposed in the openings OH, and may fill the openings OH. The encapsulation layer TFE may serve to protect the light emitting elements ED-1, ED-2, and ED-3 from moisture/oxygen, and foreign substances such as dust particles.

The encapsulation layer TFE may include at least one organic film or an inorganic film, or may include an organic film and an inorganic film. The encapsulation layer TFE may have a structure in which an organic film and an inorganic film are alternately stacked.

The inorganic film included in the encapsulation layer TFE may include, for example, a silicon nitride layer, a silicon oxynitride layer, a silicon oxide layer, a titanium oxide layer, or an aluminum oxide layer, and is not particularly limited to the above examples. The organic film included in the encapsulation layer TFE may include an acrylic organic film, and is not particularly limited.

FIG. 6 shows that the hole transport region HTR and the electron transport region ETR are provided as a common layer while covering the pixel defining films PDL, but the embodiments are not limited thereto. In an embodiment, the hole transport region HTR and the electron transport region ETR may be disposed in the openings OH defined in the pixel defining films PDL.

For example, when in addition to the emission layers EML-B, EML-G, and EML-R, the hole transport region HTR and the electron transport region ETR are provided through inkjet printing, the hole transport region HTR, the emission layer EML-B, EML-G, and EML-R, and the electron transport region ETR may be provided corresponding to the openings OH defined between the pixel defining films PDL. However, the embodiments are not limited thereto, and regardless of the method of providing each functional layer, as shown in FIG. 6, the hole transport region HTR and the electron transport region ETR are provided as a common layer while covering the pixel defining films PDL without being patterned.

In the display device ES shown in FIG. 6, although the thicknesses of the emission layers EML-B, EML-G, and EML-R of the first to third light emitting elements ED-1, ED-2, and ED-3 are shown to be similar to one another, the embodiments are not limited thereto. For example, in an embodiment, the thicknesses of the emission layers EML-B, EML-G, and EML-R of the first to third light emitting elements ED-1, ED-2, and ED-3 may be different from one another.

The display module DM may further include a light control layer PP. In an embodiment, the light control layer PP may include a color filter layer CFL. That is, the display module DM may include the color filter layer CFL disposed on the light emitting elements ED-1, ED-2, and ED-3 of the display panel DP. In an embodiment, the first filter CF-B may overlap the first pixel area PXA-B. The second filter CF-G may overlap the second pixel area PXA-G. The third filter CF-R may overlap the third pixel area PXA-R.

Referring to FIG. 6, the first to third filters CF-B, CF-G and CF-R may be separated by the light blocking unit BM and may not overlap one another. In an embodiment, when the first to third pixel areas PXA-B, PXA-G, and PXA-R have the same size, the first to third filters CF-B, CF-G, and CF-R may also have the same size. Referring to FIG. 7, the first filter CF-B may overlap the second filter CF-G and the third filter CF-R. In addition, when the first to third pixel areas PXA-B, PXA-G, and PXA-R have different sizes, the first to third filters CF-B, CF-G, and CF-R may have different heights and planar areas.

In the display device ES, the light control layer PP may not include a polarizing layer and may be formed through a low-temperature thermosetting process by including the color filter layer CFL. Accordingly, thermal damage that may occur during the manufacturing process may be reduced or prevented.

Referring to FIG. 6, the light control layer PP may not include a buffer layer BFL. In this case, the color filter layer CFL may be directly disposed on the encapsulation layer TFE. The encapsulation layer TFE may include an inorganic film on the outermost surface in contact with the color filter layer CFL. However, the embodiments of the invention are not limited thereto, and as shown in FIG. 7, the light control layer PP may include the buffer layer BFL disposed between the color filter layer CFL and the encapsulation layer TFE.

Figure 8:
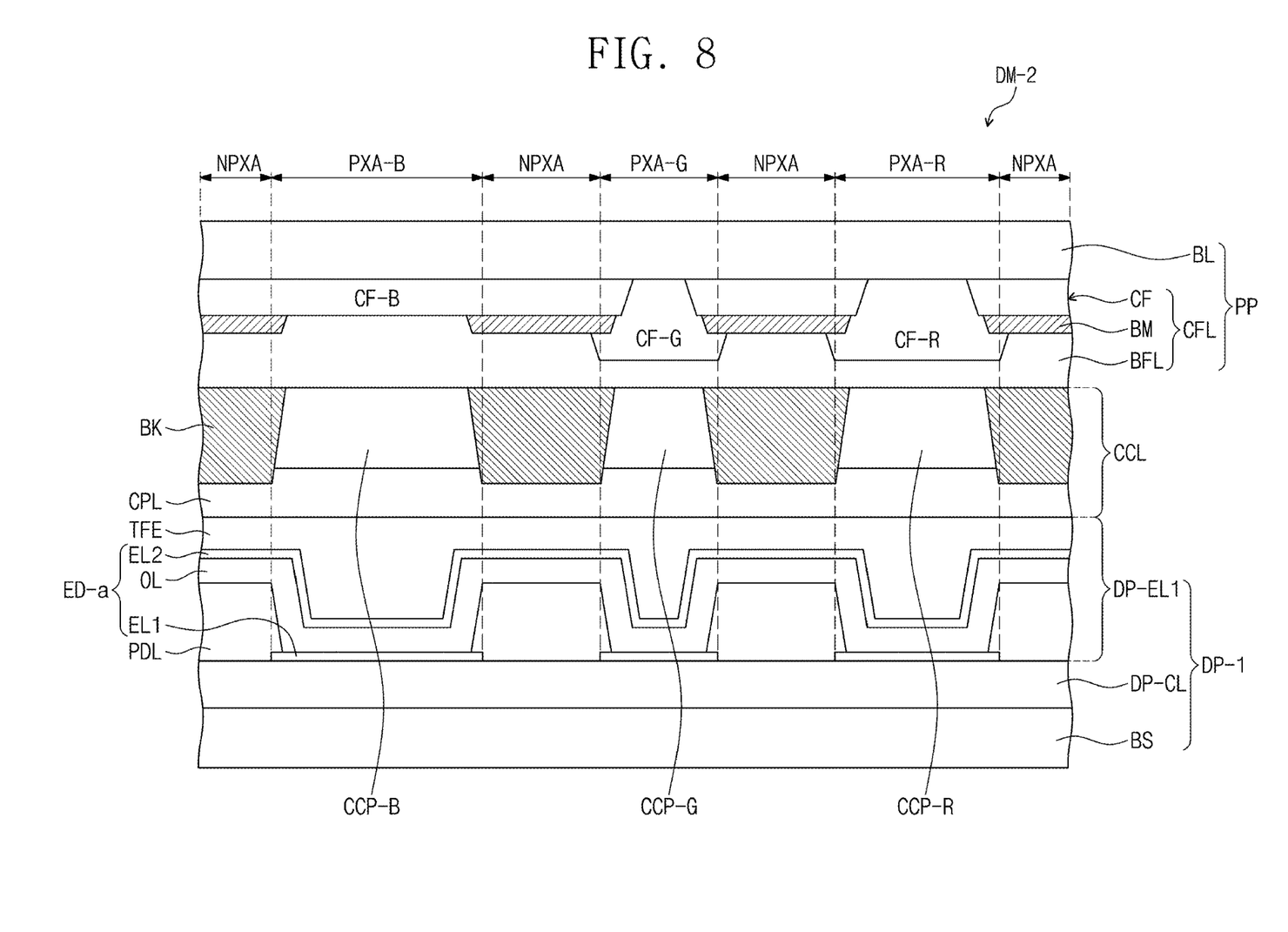
FIG. 8 is a cross-sectional view of a further embodiment of a display module constructed according to the principles of the invention.

FIG. 8 is a cross-sectional view of a further embodiment of a display module constructed according to the principles of the invention. Hereinafter, in the description of the display module DM-2, the same descriptions of elements described above with reference to FIGS. 1 to 7 will not be repeated, and differences will be mainly described to avoid redundancy.

Referring to FIG. 8, the display module DM-2 may include a first layer in the form of a light conversion layer CCL disposed on the display panel DP-1. The light conversion layer CCL may be disposed between the display panel DP-1 and the color filter layer CFL. The light conversion layer CCL may transmit light sources output from the display panel DP-1 or convert the light sources into light having different wavelengths to output various color light.

The display panel DP-1 may include a base substrate BS, a circuit layer DP-CL provided on the base substrate BS, and a display element layer DP-EL1. The display panel DP-1 may provide first light. For example, the display panel DP-1 may emit blue light. The blue light may be light having a wavelength of about 410 nm to about 480 nm, but is not limited thereto, and may include wavelength ranges that may be considered blue. This description is presented as an example, and the first light may be designed as light of various colors, and is not limited to any one embodiment.

The light emitting element layer DP-EL1 may include a light emitting element ED-a, and the light emitting element ED-a may include a first electrode EL1 and a second electrode EL2 facing each other, and a plurality of layers OL disposed between the first electrode EL1 and the second electrode EL2. The plurality of layers OL may include the hole transport region HTR (FIG. 6), the emission layer EML-B (FIG. 6), and the electron transport region ETR (FIG. 6). An encapsulation layer TFE may be disposed on the light emitting element ED-a.

In the display panel DP-1 of an embodiment, the light emitting element ED-a may generate first light. For example, the light emitting element ED-a may generate blue light. The light conversion layer CCL may include a plurality of partition walls BK disposed spaced apart from each other and light control units CCP-B, CCP-G, and CCP-R disposed between the partition walls BK. The partition walls BK may be formed from a polymer resin and a coloring additive. The partition walls BK may be formed from a light absorbing material, or formed from a pigment or a dye. For example, the partition walls BK may include a black pigment or a black dye to form a black partition wall. When forming the black partition wall, carbon black or the like may be used as a black pigment or a black dye, but the embodiments of the invention are not limited thereto.

The light conversion layer CCL may include a transmitter in the form of a light transmission unit CCP-B transmitting first light, a light controller in the form of a second light control unit CCP-G converting the first light into second light, and another light controller in the form of a third light control unit CCP-R converting the first light into third light. In an embodiment, the second light control unit CCP-G may include a base resin and quantum dots converting the first light into the second light. In an embodiment, the base resin and the third light control unit CCP-R may include quantum dots converting the first light into the third light. The quantum dots may be dispersed in the base resin.

In an embodiment, the transmission unit CCP-B may include a base resin and scatterers. The second light control unit CCP-G and the third light control unit CCP-R may further include scatterers. The scatterers may be dispersed in the base resin. The scatterers may increase light output efficiency by scattering incident light in various directions. The scatterers may include a light reflection material or a material having a predetermined refractive index. For example, the scatterers may include at least one of $TiO_2$, $ZrO_3$, $Al_2O_3$, $SiO_2$, MgO, $In_2O_3$, ZnO, $SnO_2$, $Sb_2O_3$, $SiO_2$, and ITO.

The light conversion layer CCL may further include a capping layer CPL. The capping layer CPL may be disposed below the light control units CCP-B, CCP-G, and CCP-R, and the partition walls BK. The capping layer CPL may serve to prevent penetration of at least one of moisture and oxygen (hereinafter, referred to as "moisture/oxygen"). The capping layer may be disposed on the light control units CCP-B, CCP-G, and CCP-R to prevent the light control units CCP-B, CCP-G, and CCP-R from being exposed to moisture/oxygen. The capping layer CPL may include at least one inorganic layer.

The display module DM-1 may further include a filler between the encapsulation layer TFE and the capping layer CPL. The display module DM-2 may include a color filter layer CFL disposed on the light conversion layer CCL, and the above descriptions may be equally applied to the color filter layer CFL and the base layer BL. The embodiments of the invention are not limited thereto, and the first filter CF-B may not include a first coloring agent. The first filter CF-B may be transparent.

A curable resin composition made according to the principles and embodiments of the invention include a coloring agent, a photoinitiator, and upconversion particles. The upconversion particles may absorb light in the near-infrared region and emit light in the ultraviolet region, thereby allowing curing through a photoinitiator, and thus improving curing rates.

In general, during the curing process in the forming of a color filter layer, each filter has a low curing rate because light is absorbed through a coloring agent during photocuring, and in particular, the curing rate in the bottom of the filter is very low, in which case it is highly likely that the filter may have a very large undercut even after thermal curing. However, when the filter is formed of the curable resin composition made according to the principles and embodiments of the invention, curing may be effectively performed over substantially the entire thickness, and to the inside, of the filter. Accordingly, the undercut of the filter may be reduced, and luminous efficiency characteristics may be improved.

A curable composition made according to the principles and embodiments of the invention includes upconversion particles, and may thus be used as a material for a color filter layer having a high curing rate over substantially the entire thickness, and to the inside, of the filter. A display device made according to the principles and embodiments of the invention includes a color filter layer having reduced undercuts, and may thus exhibit increased luminous efficiency.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel to generate a first light;
a first layer disposed on the display panel, and including a transmitter to transmit the first light, a light controller to convert the first light into a second light, and another light controller to convert the first light into a third light; and
a second layer disposed on the first layer, wherein the second layer includes:
a first filter to transmit the first light having a first color;
a second filter to transmit the second light having a second color different from the first color; and
a third filter to transmit the third light of a third color different from each of the first color and the second color,
at least one of the first to third filters comprising a coloring agent, a photoinitiator, and particles to absorb light in the near-infrared region and to emit light in the ultraviolet region.

2. The display device of claim 1, wherein:
the first light is blue light;
the second light is green light; and
the third light is red light.

3. The display device of claim 1, wherein:
the display panel comprises a light emitter to generate the first light and an encapsulation member disposed on the light emitter; and
the display panel further comprises a capping layer disposed on the encapsulation member and the light control layer.

4. The display device of claim 1, wherein:
the light controller comprises a second light control unit having one or more first quantum dots to convert the first light into the second light; and
the another light controller comprising a third light control unit, having one or more second quantum dots to convert the first light into the third light.

5. The display device of claim 1, wherein the particles comprises upconversion particles including lanthanide atoms.

6. The display device of claim 5, wherein the upconversion particles comprise at least one of NaYF$_4$:Yb$^{3+}$/Er$^{3+}$, NaGdF$_4$:Yb$^{3+}$/Er$^{3+}$, NaYF$_4$:Yb$_3$/Tm$^{3+}$, NaY(Mn)F$_4$:Yb$^{3+}$/Er$^{3+}$, NaGdF$_4$:Yb$^{3+}$/Er$^{3+}$, and LiYF$_4$:Yb$^{3+}$/Er$^{3+}$.

7. The display device of claim 1, wherein at least some of the particles comprise upconversion particles having a size of about 1 nm to about 100 nm.

8. The display device of claim 1, wherein the first to third filters each have a thickness of about 1 μm to about 5 μm, and the first layer comprises a light conversion layer, the second layer comprises a color filter layer, the light controller comprises a second light control unit, and another light controller comprises a third light control unit.

9. The display device of claim 1, wherein
at least one of the first filter, the second filter and the third filter is a color filter, and
the coloring agent is included in a range of about 0.3 wt % to about 40 wt % based on 100 wt % of the total amount of the curable resin composition.

10. A display device comprising:
first to third pixel areas adjacent to each other when viewed in plan;
a display panel including a first light emitter overlapping the first pixel area, a second light emitter overlapping the second pixel area, and a third light emitter overlapping the third pixel area; and
a filter layer disposed on the display panel, and including a first filter overlapping the first pixel area, a second filter overlapping the second pixel area, and a third filter overlapping the third pixel area, wherein
the first filter to transmit light of a first color, the second filter to transmit light of a second color different from the first color, and a third filter to transmit light of a third color different from each of the first color and the second color, and
at least one of the first to third filters comprises a photoinitiator, a coloring agent, and particles to absorb light in the near-infrared region and to emit light in the ultraviolet region.

11. The display device of claim 10, wherein:
the first light emitter is configured to emit a first light and comprises a first light emitting element;
the second light emitter is configured to emit a second light and comprises a second light emitting element; and
the third light emitter is configured to emit a third light and comprises a third light emitting element.

12. The display device of claim 10, wherein the particles comprise upconversion particles comprising lanthanide atoms.

13. The display device of claim 12, wherein the upconversion particles comprise at least one of Nd, Ho, Er, Tm, and Tb.

14. The display device of claim 10, wherein at least one of the first filter, the second filter, and the third filter include a cured resin formed from a curable resin, the curable resin comprising:
the coloring agent;
the photoinitiator; and
one or more particles to absorb light in the near-infrared region and to emit light in the ultraviolet region, wherein
the coloring agent is included in a range of about 0.3 wt % to about 40 wt % based on 100 wt % of the total amount of the curable resin composition.

15. The display device of claim 14, wherein the one or more particles comprise upconversion particles including lanthanide atoms.

16. The display device of claim 15, wherein the one or more upconversion particles comprise at least one of Nd, Ho, Er, Tm, and Tb.

17. The display device of claim 14, wherein the one or more particles comprise at least one of NaYF4:Yb$^{3+}$/Er$^{3+}$, NaGdF4:Yb$^{3+}$/Er$^{3+}$, NaYF4:Yb3/Tm$^{3+}$, NaY(Mn)F4:Yb$^{3+}$/Er$^{3+}$, NaGdF4:Yb$^{3+}$/Er$^{3+}$, and LiYF4:Yb$^{3+}$/Er$^{3+}$.

18. The display device of claim 14, wherein at least some of the one or more particles comprise upconversion particles having a size of about 1 nm to about 100 nm.

19. The display device of claim 14, wherein the one or more particles comprise upconversion particles in an amount of about 10 wt % or less, based on 100 wt % of a total amount of the curable resin.

20. The display device of claim 14, wherein the photoinitiator comprises at least one of a benzophenone compound, an oxime ester compound, and a phosphine oxide compound.

21. The display device of claim 14, wherein the photoinitiator is present in an amount of about 0.5 wt % to about 5 wt %, based on 100 wt % of a total amount of the curable resin composition.

22. The display device of claim 10, wherein the coloring agent is included in a range of about 0.3 wt % to about 40 wt % based on 100 wt % of the total amount of the curable resin composition.

\* \* \* \* \*